(12) United States Patent
Chou et al.

(10) Patent No.: US 7,959,448 B1
(45) Date of Patent: Jun. 14, 2011

(54) FLASH MEMORY DEVICE WITH SLIDABLE CONTACT MODULE

(75) Inventors: Tsu-Liang Chou, Chung Ho (TW);
Cheng-Fu Yau, Chung Ho (TW);
Wei-Jen Cheng, Chung Ho (TW);
Yu-Cheng Kang, Chung Ho (TW);
Mei-Chih Chen, Chung Ho (TW);
Ming-Ta Yang, Chung Ho (TW)

(73) Assignee: A-Data Technology (Suzhou) Co., Ltd., Suzhou, Jiangsu Province (CN)

( * ) Notice: Subject to any disclaimer, the term of this patent is extended or adjusted under 35 U.S.C. 154(b) by 0 days.

(21) Appl. No.: 12/797,597

(22) Filed: Jun. 9, 2010

(30) Foreign Application Priority Data

Nov. 27, 2009 (CN) .......................... 2009 1 0232044

(51) Int. Cl.
*H01R 13/44* (2006.01)
(52) U.S. Cl. ........................................ 439/131; 439/660
(58) Field of Classification Search .................. 439/131, 439/660
See application file for complete search history.

(56) References Cited

U.S. PATENT DOCUMENTS

| 7,307,849 | B2 | 12/2007 | Ho et al. | |
| 7,535,719 | B2 | 5/2009 | Hiew et al. | |
| 2009/0137137 | A1* | 5/2009 | Jeong et al. | 439/131 |
| 2010/0279526 | A1* | 11/2010 | Chiang | 439/131 |

* cited by examiner

*Primary Examiner* — Hien Vu
(74) *Attorney, Agent, or Firm* — Cheng-Ju Chiang

(57) ABSTRACT

A flash memory device includes a circuit board and a contact module slidable with respect to the circuit board. The circuit board includes a plurality of first contacts each having a stiff first contact portion. The contact module includes a slider and a plurality of second contacts fixed to the slider. The slider is slidable with respect to the circuit board along a front-to-rear direction between a first position and a second position. The flash memory device is compatible to USB 2.0 and USB 3.0 receptacle connectors via the slidable contact module.

10 Claims, 10 Drawing Sheets

FLASH MEMORY DEVICE WITH SLIDABLE CONTACT MODULE

BACKGROUND OF THE INVENTION

1. Field of the Invention

The present invention relates to a personal computer peripheral device, and more particularly to a flash memory device with a slidable contact module so that the flash memory device is compatible to mate with USB 2.0 and USB 3.0 receptacle connectors.

2. Description of Related Art

With the fast development of the electrical domain, flash memory is currently used in variety of apparatus including digital cellular phone, digital camera, PC card, and digital setup box or inner controller for notebook computer. A flash memory device such as a U-disk is widely used as an intermedium for accessing data files from one device to another, or like a portable hard drive for installing data.

Usually, a flash memory device includes a circuit board with a plurality of electronic components, such as driver chip, memory chip, oscillator, resistor, etc. for saving and loading data, functioning as a miniature hard drive or wireless communication/transmission, a connector port connected to one end of the circuit board, and a cover enclosing the circuit board. In order to decrease profile of the flash memory device, a so-called Chip-On-Board (COB) IC packaging technology comes into being. Usually, a COB type circuit board includes an embedded chip and a plurality of golden fingers connected to the chip via a plurality of bonding wires.

Anyhow, Universal Serial Bus (USB) has been widely used as a standard connector port because of its self detection and hot plug etc. Nowadays, the most widely used USB ports measure up to USB specification version 2.0 and such USB connectors are accordingly called USB 2.0 connectors as shown in FIG. 1A. However, with the fast development of the information technologies, the current transmission speed of the USB 2.0 connectors can't meet higher demands. As a result, USB 3.0 connectors with transmission speed decuple faster than the USB 2.0 connectors come with the tide of fashion.

As shown in FIG. 1A, a USB 2.0 receptacle connector A1 includes four deformable contact member A11 for mating with a corresponding USB 2.0 plug to transmit USB 2.0 signals.

As shown in FIG. 1B, a USB 3.0 receptacle connector A2 includes four first contact member A21 and five second contact member A22 located at the front of the first contact member A21. The second contact member A22 is recessed with respect to a mating surface A23. The first and the second contact members A21, A22 jointly abut against a corresponding USB 3.0 plug to transmit USB 3.0 signals.

In the interim, USB 2.0 and USB 3.0 receptacle connectors are coexisted in the market, so there is a demand to provide USB flash memory devices which are compatible to USB 2.0 and USB 3.0 receptacle connectors, and can be provided for mating with the USB 2.0 and USB 3.0 receptacle connectors, selectively.

Hence, an improved flash memory device with slidable contact module are needed to solve the problem above.

BRIEF SUMMARY OF THE INVENTION

The present invention provides a flash memory device including a circuit board and a contact module slidable with respect to the circuit board. The circuit board includes a plurality of first contacts each comprising a stiff first contact portion. The contact module includes a slider and a plurality of second contacts fixed to the slider. The slider is slidable with respect to the circuit board along a front-to-rear direction between a first position and a second position. Each second contact includes a second contact portion located behind the first contact portions along the front-to-rear direction. The second contact portions are arranged above the first contact portions. When the contact module is located at the first position, the first and the second contact portions are provided for jointly engaging with corresponding contacts of a first receptacle connector. Besides, when the contact module is located at the second position, only the first contact portions are provided for engaging with corresponding contacts of a second receptacle connector which is different from the first receptacle connector. As a result, the flash memory device is compatible to the first and the second receptacle connectors via the slidable contact module.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1A:
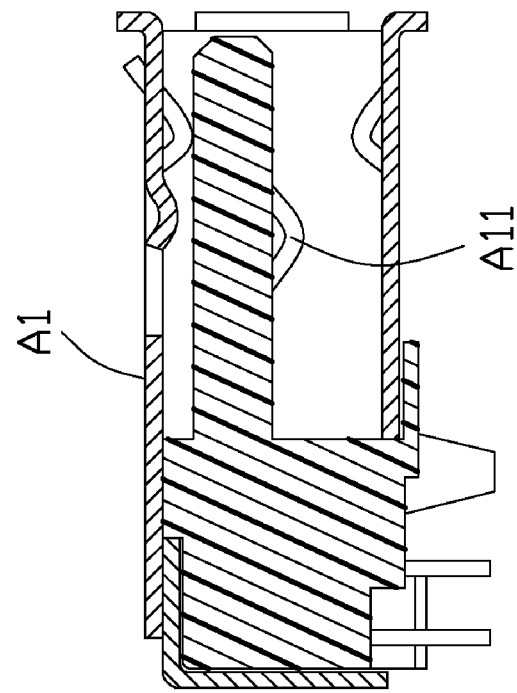
FIG. 1A is a schematic view of a prior art USB 2.0 receptacle connector.
Figure 1A:
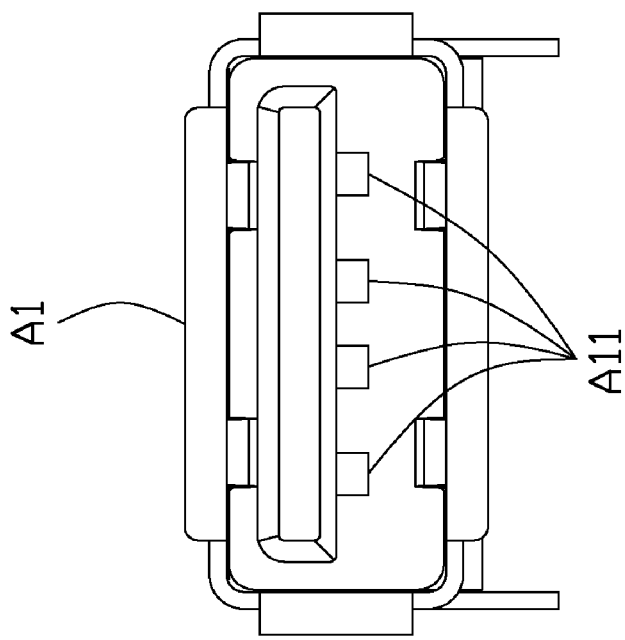
Figure 1B:
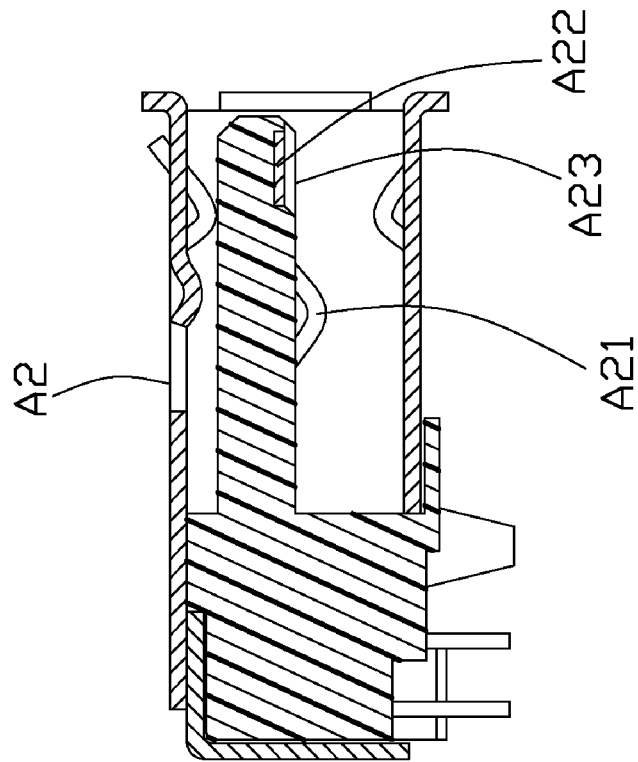
FIG. 1B is a schematic view of a prior art USB 3.0 receptacle connector.
Figure 1B:
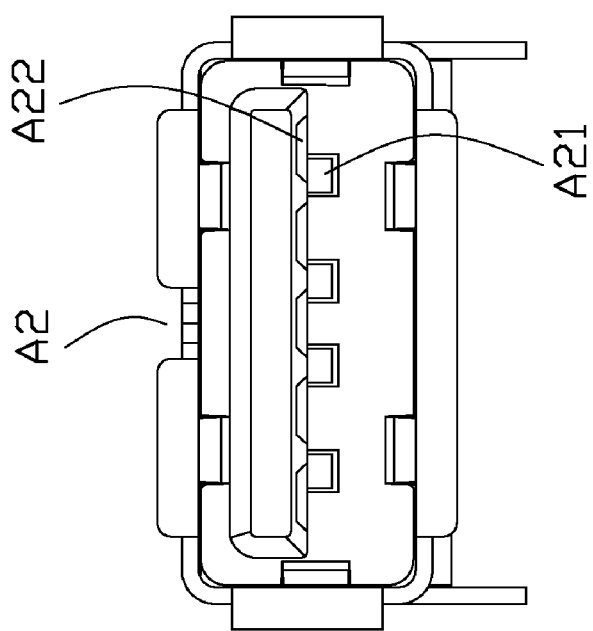

Reference will now be made to the drawing figures to describe the embodiments of the present invention in detail. In the following description, the same drawing reference numerals are used for the same elements in different drawings.

Figure 2A:
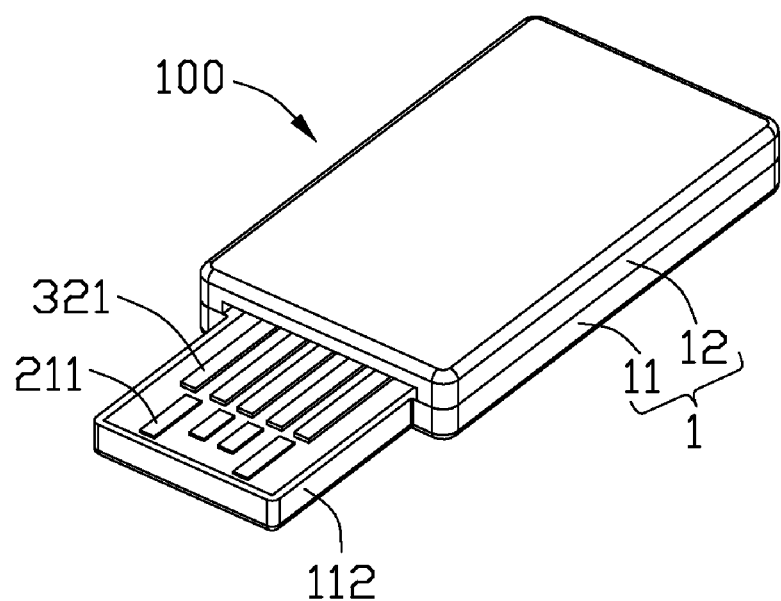
FIG. 2A is a perspective view of a flash memory device with a contact module thereof located at an original first position, according to a first embodiment of the present invention.
Figure 2B:
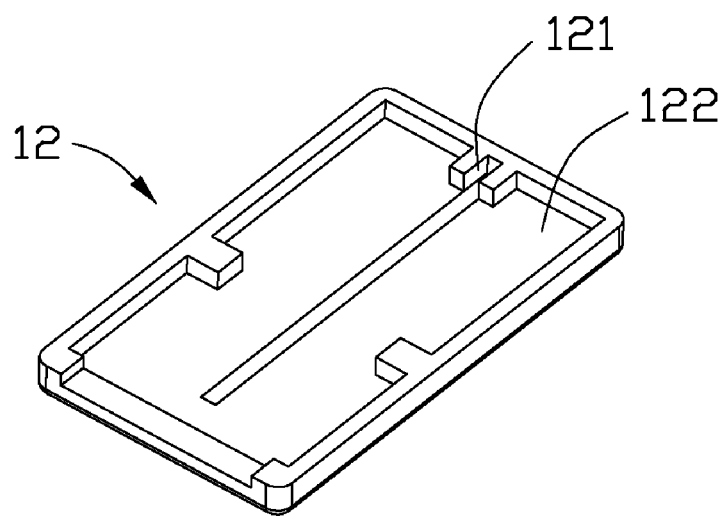
FIG. 2B is a perspective view of a cover of the flash memory device shown in FIG. 2A.
Figure 2C:
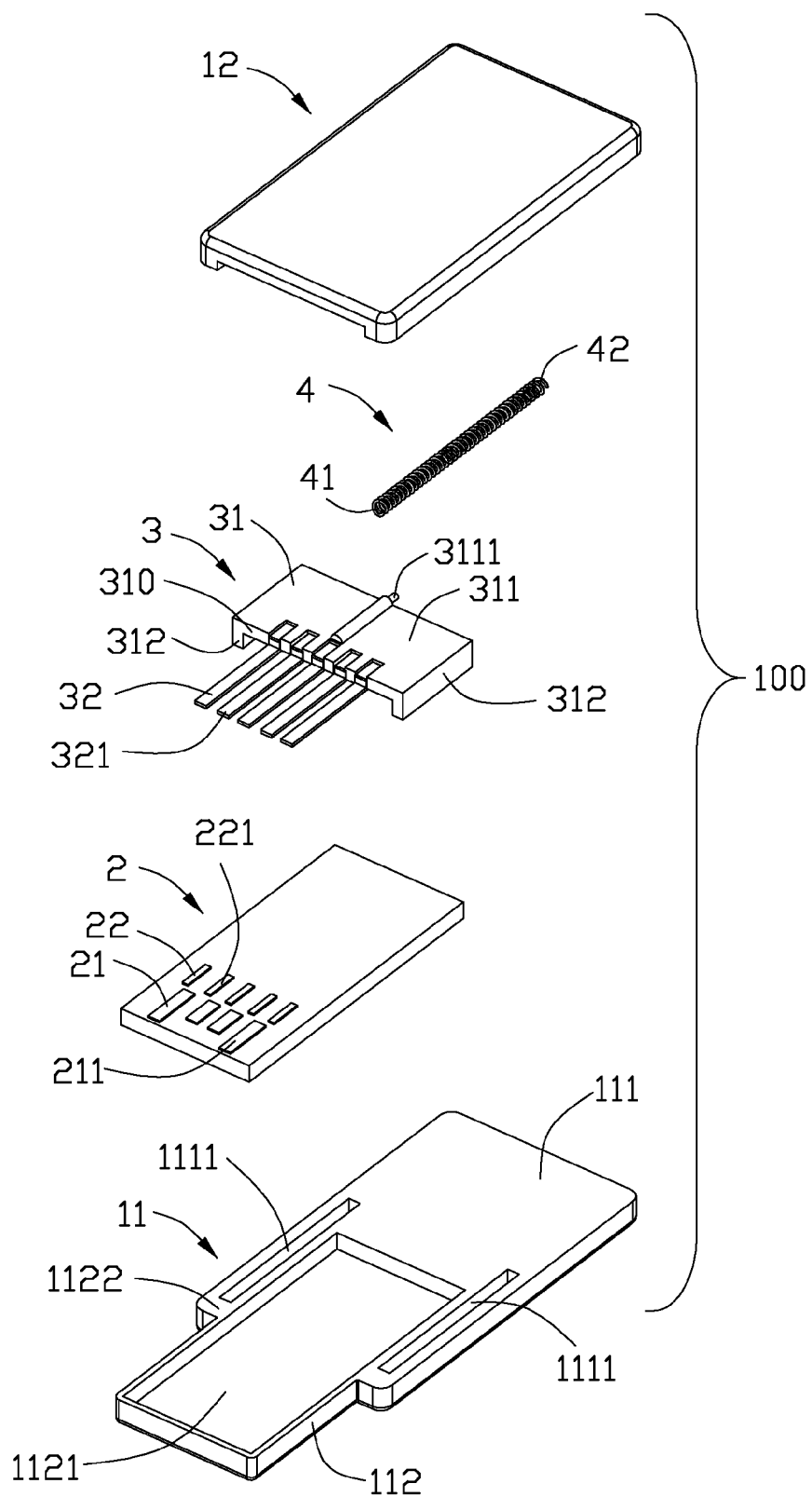
FIG. 2C is an exploded view of the flash memory device shown in FIG. 2A.

Referring to FIGS. 2A, 2B and 2C, a flash memory device 100 which can be used for data transmission with a host device according to a preferred embodiment of the present invention is disclosed. The flash memory device 100 is compatible to USB standard and can be alternatively inserted into a USB 3.0 receptacle connector or a USB 2.0 receptacle connector for transmitting USB 3.0 signals or USB 2.0 signals, respectively. According to a first embodiment of the present invention, the flash memory device 100 includes an outer shell 1, a Chip-On-Board (COB) type printed circuit board 2, a contact module 3 slidably mounted in the outer shell 1, and an elastic member 4 for abutting against the contact module 3.

The outer shell 1 includes a base 11 and a cover 12 attached to the base 11. The base 11 includes a main portion 111 and a rectangular contracted portion 112 extending forwardly from the main portion 111. The contracted portion 112 defines a rectangular recess 1121 on an upper wall 1122. The recess 1121 further extends backwardly to the main portion 111 for receiving the printed circuit board 2. The main portion 111 defines a pair of slots 1111 formed at lateral sides of the recess 1121. As shown in FIG. 2B, the cover 12 includes a slit 121 formed on an inner side 122 thereof for abutting against the elastic member 4.

The printed circuit board 2 is rectangular and includes a plurality of first contacts 21, a plurality of transfer contacts 22 and a chip (not shown) electrically connecting the first and the transfer contacts 21, 22. Each first contact 21 includes a stiff first contact portion 211. Each transfer contact 22 includes an engaging portion 221 located behind the first contact portions 211 along a front-to-rear direction.

Figure 4A:
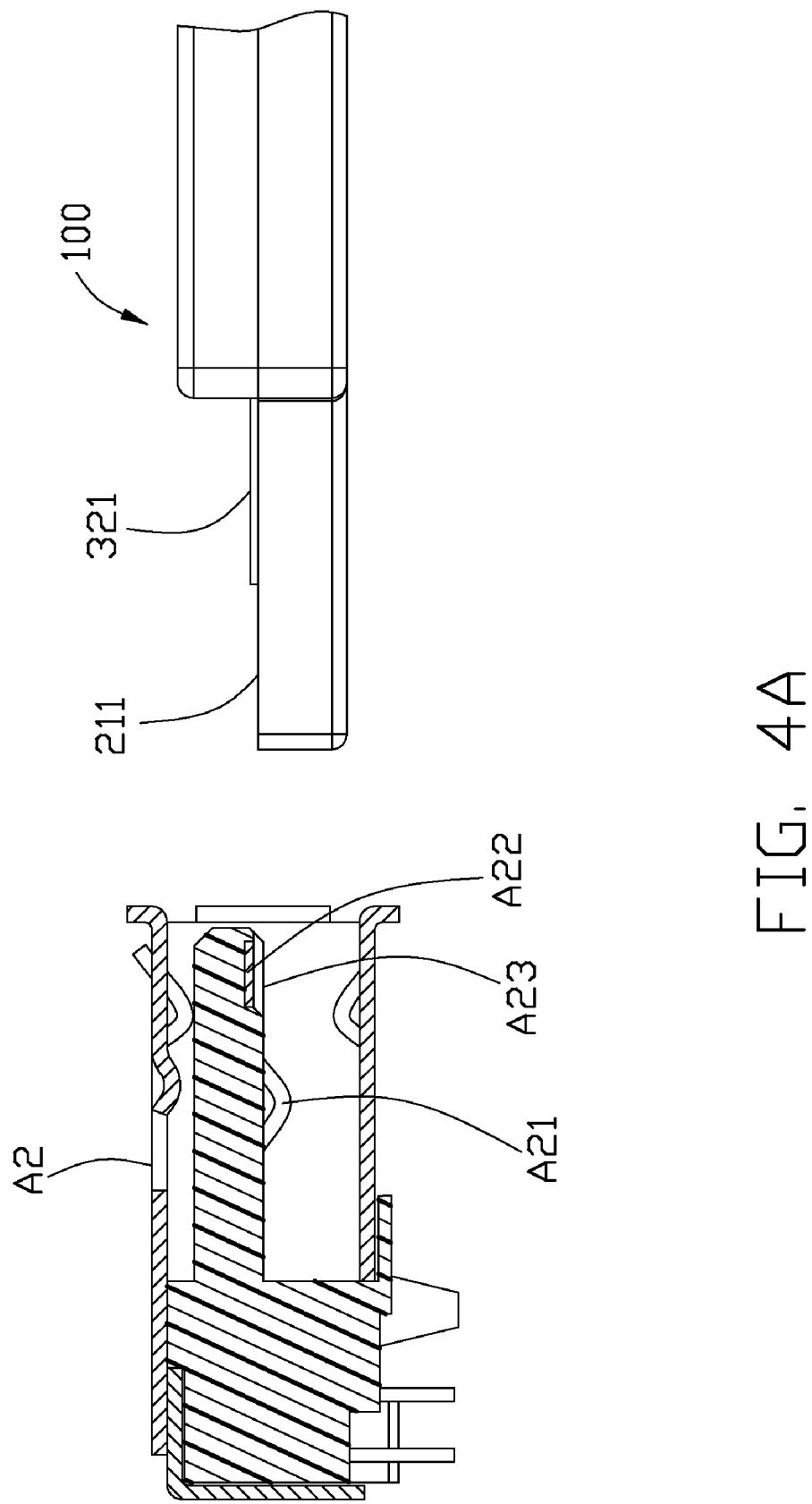
FIG. 4A is a schematic view of the flash memory device shown in FIG. 2A under a condition that the flash memory device is before insertion into the USB 3.0 receptacle connector.

The contact module 3 includes a slider 31 and a plurality of second contacts 32 fixed to the slider 31. The slider 31 includes a top wall 311 and a pair of side walls 312 extending downwardly from the top wall 311. The top wall 311 includes a mounting post 3111 extending backwardly beyond the slider 31. Each second contact 32 includes a plate-shaped second contact portion 321 cantileveredly extending forwardly from a front end 310 of the slider 31. The slider 31 is mounted on the base 11 with the side walls 312 moveable in the slots 1111. As best shown in FIGS. 2A and 4A, the second contact portions 321 are located behind the first contact portions 211 along the front-to-rear direction. Besides, the second contact portions 321 are located above the first contact portions 211.

The elastic member 4 according to the first embodiment of the present invention is a coiled spring. In assembly, one end 41 of the elastic member 4 is fastened to the mounting post 3111 and the other end 42 of the elastic member 4 is fastened in the slit 121.

The slider 3 is slidable between an original first position (as shown in FIG. 2A) and a later second position behind the first position. As shown in FIG. 4A, when the flash memory device 100 is inserted into a USB 3.0 receptacle connector A2, the second contact portions 321 can pass a mating surface of the USB 3.0 receptacle connector A2 through a plurality of recessed conductive contacts A22. As a result, keeping the slider 31 at the first position, the flash memory device 100 can be inserted into the USB 3.0 receptacle connector A2. The second contact portions 321 touch the engaging portions 221 of the transfer contact 22 along a vertical direction perpendicular to the front-to-rear direction. Under this condition, the first and the second contact portions 211, 321 jointly abut against the contacts A21, A22 of the USB 3.0 receptacle connector A2 for transmitting USB 3.0 signals. The plate-shaped second contact portions 321 can provide big contact area for mating with the corresponding planar contacts A22.

Figure 4B:
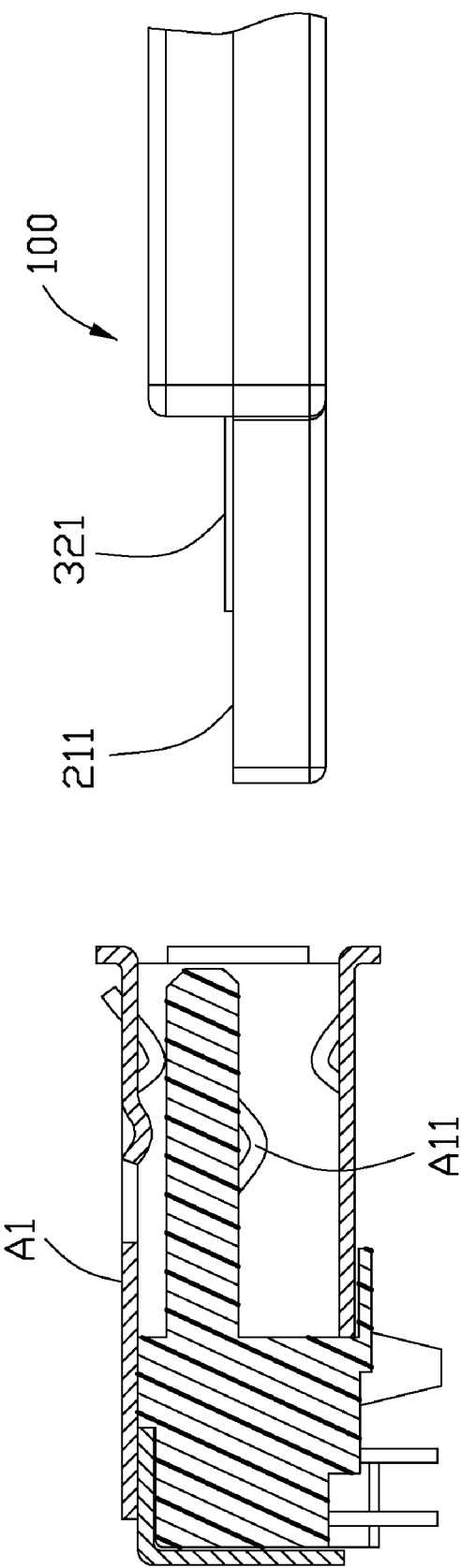
FIG. 4B is a schematic view of the flash memory device shown in FIG. 2A under a condition that the flash memory device is before insertion into the USB 2.0 receptacle connector.

However, as shown in FIG. 4B, when the flash memory device 100 is inserted into a USB 2.0 receptacle connector A1, the second contact portions 321 are stopped by the mating surface of the USB 2.0 receptacle connector A1 because the second contact portions 321 extend above the first contact portions 211 and no recessed area is provided at the mating surface of the USB 2.0 receptacle connector A1. With insertion of the flash memory device 100 further into the USB 2.0 receptacle connector A1, the slider 31 is driven to move backwardly with respect to the printed circuit board 2 till to the second position. The elastic member 4 is compressed. Under this condition, the second contact portions 321 are hidden in the outer shell 1 and only the first contact portions 211 are exposed to abut against the contacts All for transmitting USB 2.0 signals. When the flash memory device 100 is removed from USB 2.0 receptacle connector A1, the compressed elastic member 4 releases the restoring force to drive the slider 31 get back to the first position.

Figure 3A:
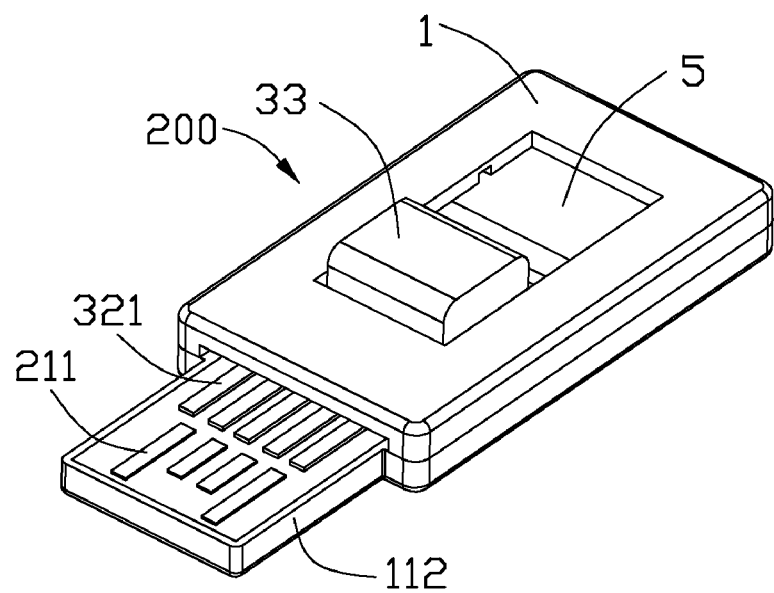
FIG. 3A is a perspective view of a flash memory device with a contact module thereof located at a first position, according to a second embodiment of the present invention.
Figure 3B:
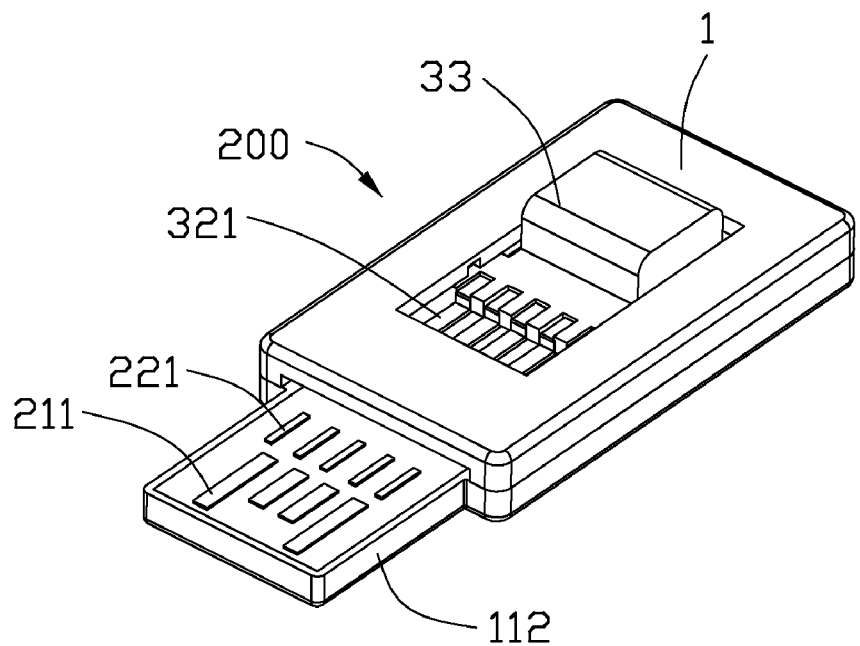
FIG. 3B is another perspective view of the flash memory device shown in FIG. 3A under a condition that the contact module moves to a second position.
Figure 3C:
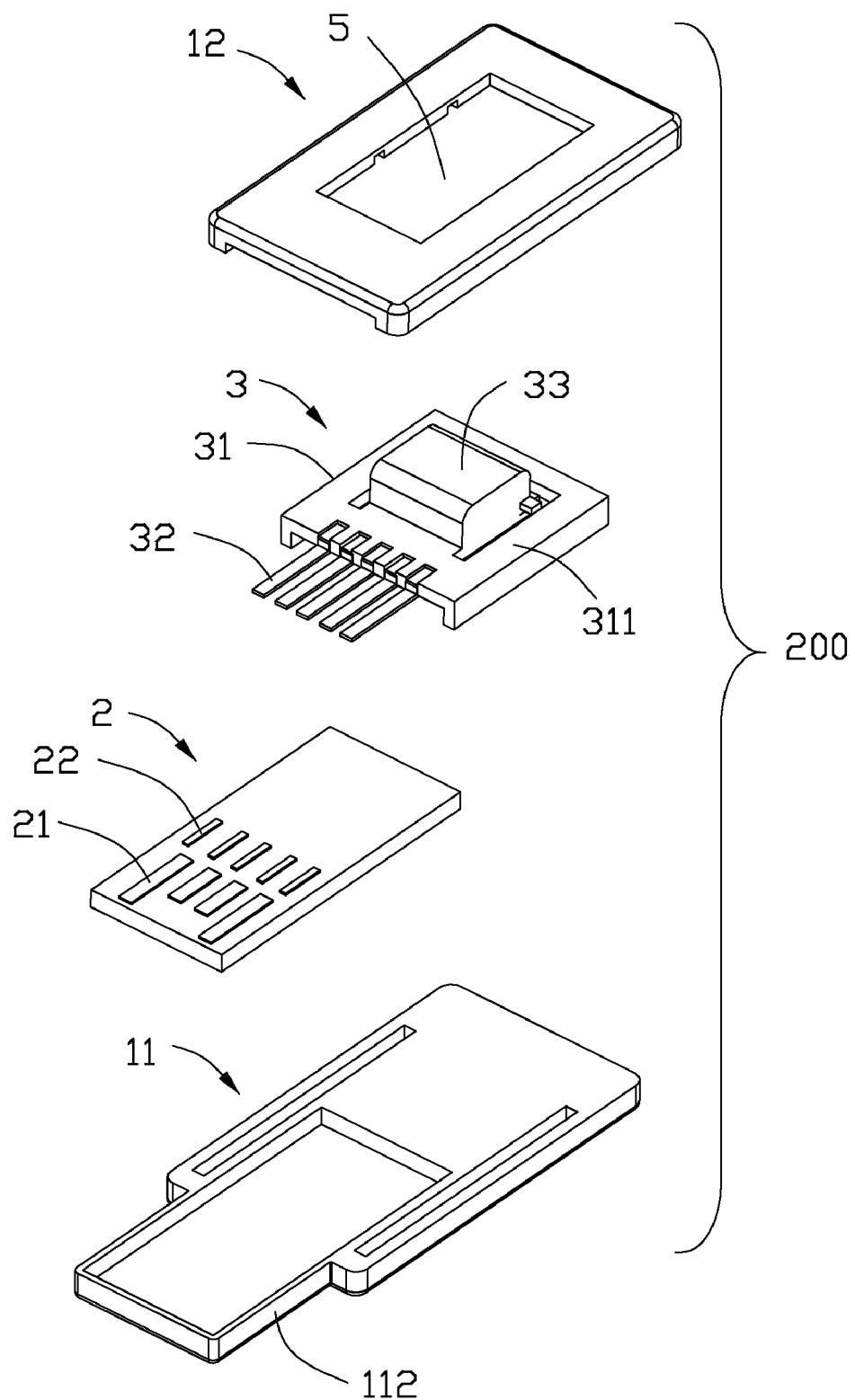
FIG. 3C is an exploded view of the flash memory device shown in FIG. 3A.

Referring to FIGS. 3A, 3B and 3C, a flash memory device 200 according to a second embodiment is disclosed. The flash memory device 200 is similar to the flash memory device 100 of the first embodiment. The main differences between them are that the elastic member 4 provided in the first embodiment is omitted in the second embodiment, and the slider 31 further includes a slide switch 33 exposed to the exterior for being pushed by the user along the front-to-rear direction so as to drive the slider 31 moveable between the first and the second positions.

Referring to FIG. 3C, the cover 12 defines a rectangular slot 5 extending along the front-to-rear direction. The slot 5 extends through the cover 12 along the vertical direction. The slide switch 33 extends upwardly from the top wall 311 to be slidably received in the slot 5.

Figure 5A:
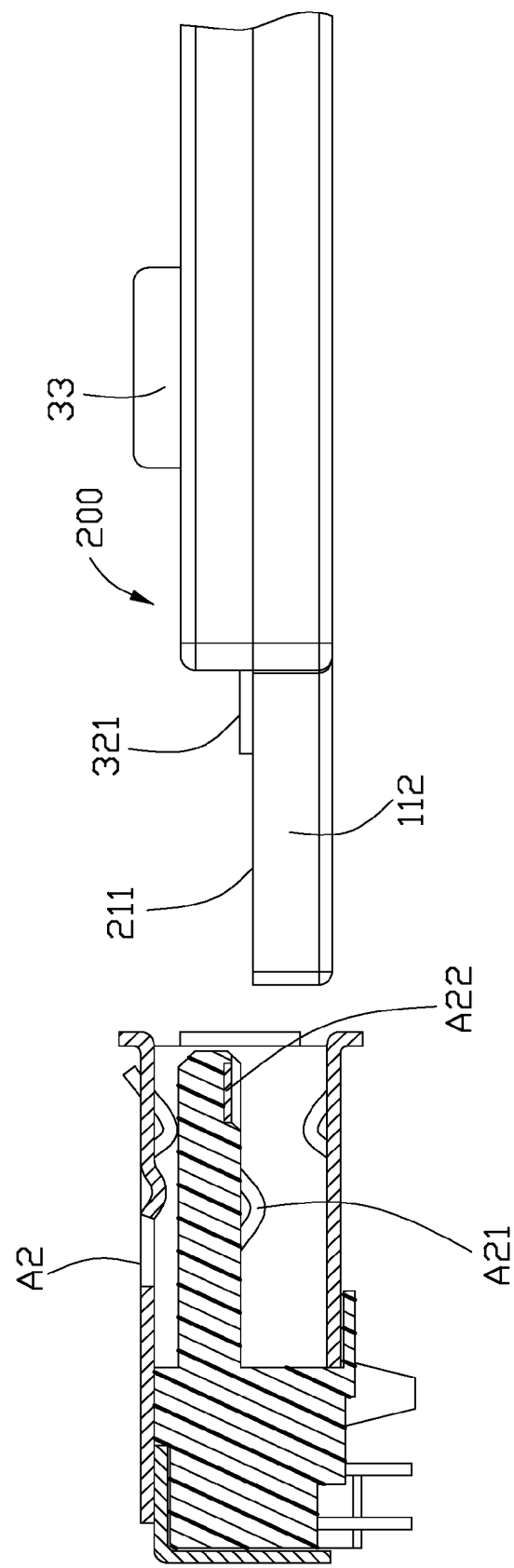
FIG. 5A is a schematic view of the flash memory device shown in FIG. 3A under a condition that the flash memory device is before insertion into the USB 3.0 receptacle connector.

As shown in FIGS. 3A and 5A, when the flash memory device 200 is adapted to be inserted into the USB 3.0 receptacle connector A2, the slider 31 is driven to the first position by push the slide switch 33. Under this condition, the first and the second contact portions 211, 321 are exposed to abut against the contacts A21, A22 of the USB 3.0 receptacle connector A2 for transmitting USB 3.0 signals.

Figure 5B:
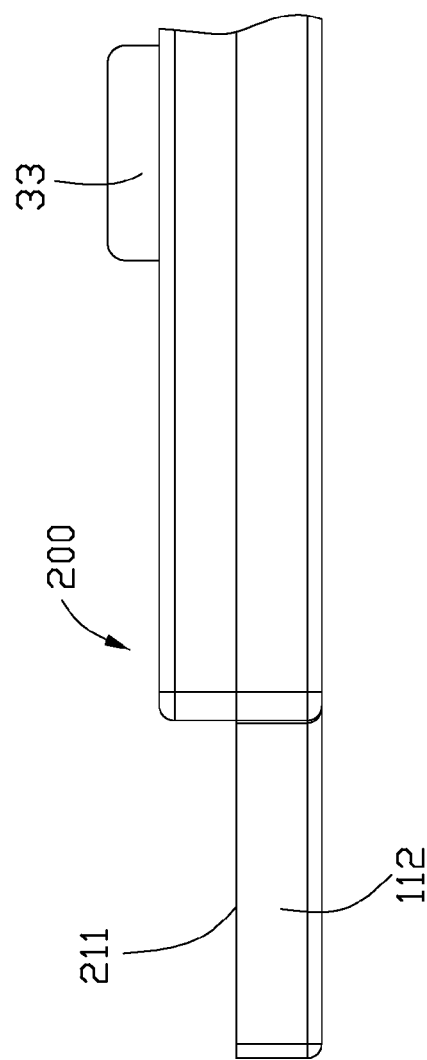
FIG. 5B is a schematic view of the flash memory device shown in FIG. 3B under a condition that the flash memory device is before insertion into the USB 2.0 receptacle connector.
Figure 5B:
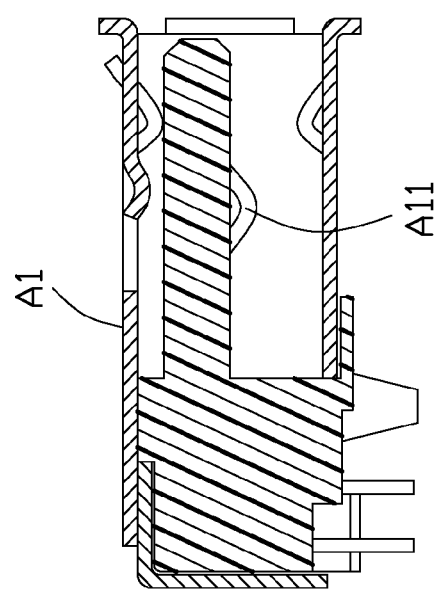

As shown in FIGS. 3B and 5B, when the flash memory device 200 is adapted to be inserted into the USB 2.0 receptacle connector A1, the slider 31 is backwardly driven to the second position. Under this condition, only the first contact portions 211 are exposed to abut against the contacts All of the USB 2.0 receptacle connector A1 for transmitting USB 2.0 signals.

It is to be understood, however, that even though numerous, characteristics and advantages of the present invention have been set forth in the foregoing description, together with details of the structure and function of the invention, the disclosed is illustrative only, and changes may be made in detail, especially in matters of number, shape, size, and arrangement of parts within the principles of the invention to the full extent indicated by the broad general meaning of the terms in which the appended claims are expressed.

What is claimed is:

1. A flash memory device comprising:
a circuit board having a plurality of first contacts each comprising a stiff first contact portion;
a contact module comprising a slider having a mounting post and a plurality of second contacts fixed to the slider, the slider being slidable with respect to the circuit board along a front-to-rear direction between an original first position and a later second position, each second contact comprising a second contact portion located behind the first contact portions along the front-to-rear direction, and the second contact portions being arranged above the first contact portions; and
an elastic member mateable with the mounting post of the contact module in order to provide a restoring force when the contact module returns from the second position to the first position;
wherein when the contact module is located at the first position, the first and the second contact portions are provided for engaging with corresponding contacts of a first receptacle connector;
wherein when the contact module is located at the second position, only the first contact portions are provided for engaging with corresponding contacts of a second receptacle connector which is different from the first receptacle connector;
wherein the second contact portions are plate-shaped and extend forwardly beyond a front end of the slider; and
wherein the first and the second receptacle connectors are USB 3.0 and USB 2.0 receptacle connectors, respectively, the second contact portions protruding into the USB 3.0 receptacle connector while the second contact portions being stopped by the USB 2.0 receptacle connector.

2. The flash memory device according to claim 1, wherein the circuit board comprises a plurality of transfer contacts each comprising an engaging portion located behind the first contact portions along the front-to-rear direction; the engaging portions alternatively touching the second contact portions.

3. The flash memory device according to claim 2, wherein the second contact portions touch the engaging portions when the contact module is located at the first position; and wherein the second contact portions are separated from the engaging portions when the contact module is located at the second position.

4. The flash memory device according to claim 1, further comprising a base defining a recess to receive the circuit board, the slider being mounted on the base.

5. The flash memory device according to claim 4, wherein the base defines a pair of slots on lateral sides thereof, the slider comprising a top wall to fix the second contacts and a pair of side walls extending downwardly from the top wall to be slidably received in the slots.

6. The flash memory device according to claim 5, wherein the base comprises a main portion and a contracted portion extending forwardly from the main portion, the recess being formed in the contracted portion and further extending backwardly to the main portion; the slots being formed in the main portion and being located at opposite sides of the recess.

7. The flash memory device according to claim 4, further comprising a cover attached to the base, one end of the elastic member abutting against the slider and the other end of the elastic member abutting against the cover.

8. The flash memory device according to claim 7, wherein the slider comprises a mounting post to fasten the one end of the elastic member, an inner side of the cover defining a slit to fasten the other end of the elastic member; and wherein the elastic member is a coiled spring.

9. A flash memory device compatible to USB standard comprising:
a circuit board having a plurality of first contacts, each first contact comprising a stiff first contact portion; and
a contact module comprising a slider having a mounting post and a plurality of second contacts fixed to the slider, the slider being slidable with respect to the circuit board along a front-to-rear direction between a first position and a second position, each second contact comprising a second contact portion located behind the first contact portions along the front-to-rear direction, and the second contact portions being arranged above the first contact portions;
wherein an elastic member mateable with the mounting post of the contact module in order to provide a restoring force when the contact module returns from the second position to the first position;
wherein the second contact portions are plate-shaped and cantileveredly extend from a front end of the slider; and
when the contact module is located at the first position, the first and the second contact portions are jointly provided for transmitting USB 3.0 signals; and wherein when the contact module is located at the second position, only the first contact portions are provided for transmitting USB 2.0 signals.

10. The flash memory device according to claim 9, wherein the circuit board comprises a plurality of transfer contacts each comprising an engaging portion located behind the first contact portions along the front-to-rear direction; the engaging portions alternatively touching the second contact portions along a vertical direction perpendicular to the front-to-rear direction.

* * * * *